United States Patent
Lee et al.

(10) Patent No.: US 11,244,870 B2
(45) Date of Patent: Feb. 8, 2022

(54) MASKLESS TOP SOURCE/DRAIN EPITAXIAL GROWTH ON VERTICAL TRANSPORT FIELD EFFECT TRANSISTOR

(71) Applicant: International Business Machines Corporation, Armonk, NY (US)

(72) Inventors: ChoongHyun Lee, Rensselaer, NY (US); Shogo Mochizuki, Clifton Park, NY (US); Injo Ok, Loudonville, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 16/839,324

(22) Filed: Apr. 3, 2020

(65) Prior Publication Data
US 2020/0235015 A1    Jul. 23, 2020

Related U.S. Application Data

(62) Division of application No. 16/173,754, filed on Oct. 29, 2018, now abandoned.

(51) Int. Cl.
| | |
|---|---|
| *H01L 21/8238* | (2006.01) |
| *H01L 21/02* | (2006.01) |
| *H01L 27/092* | (2006.01) |
| *H01L 21/324* | (2006.01) |
| *H01L 29/66* | (2006.01) |

(Continued)

(52) U.S. Cl.
CPC ......... *H01L 21/823814* (2013.01); *H01L 21/02164* (2013.01); *H01L 21/02255* (2013.01); *H01L 21/02532* (2013.01); *H01L 21/2255* (2013.01); *H01L 21/324* (2013.01); *H01L 21/823807* (2013.01); *H01L 21/823885* (2013.01); *H01L 27/092* (2013.01); *H01L 29/0847* (2013.01); *H01L 29/161* (2013.01); *H01L 29/66553* (2013.01); *H01L 29/66666* (2013.01); *H01L 29/7827* (2013.01)

(58) Field of Classification Search
CPC .......... H01L 29/7827; H01L 29/66666; H01L 27/092; H01L 21/823487; H01L 21/823885
See application file for complete search history.

(56) References Cited

U.S. PATENT DOCUMENTS

| | | |
|---|---|---|
| 9,299,835 B1 | 3/2016 | Anderson et al. |
| 9,653,458 B1 | 5/2017 | Cheng et al. |

(Continued)

OTHER PUBLICATIONS

List of IBM Patents or Patent Applications Treated as Related.

*Primary Examiner* — Raj R Gupta
(74) *Attorney, Agent, or Firm* — Erik Johnson; Ryan, Mason & Lewis, LLP

(57) ABSTRACT

A method for fabricating a vertical transistor device includes forming a first plurality of fins in a first device region and a second plurality of fins in a second device region on a substrate. The first plurality of fins have a SiGe portion exposed above a top surface of the first region and a portion of the second plurality of fins are exposed above a top surface of the second region. The method further includes depositing a first $GeO_2$ layer on the top surface of the device and over the exposed SiGe portion of the first plurality of fins and the exposed portion of the second plurality of fins.

20 Claims, 12 Drawing Sheets

(51) Int. Cl.
*H01L 29/08* (2006.01)
*H01L 29/161* (2006.01)
*H01L 29/78* (2006.01)
*H01L 21/225* (2006.01)

(56) References Cited

U.S. PATENT DOCUMENTS

| | | |
|---|---|---|
| 9,653,465 B1 | 5/2017 | Balakrishnan et al. |
| 9,773,901 B1 * | 9/2017 | Gluschenkov ...... H01L 29/0847 |
| 9,991,365 B1 | 6/2018 | Cheng et al. |
| 10,373,912 B2 | 8/2019 | Lee et al. |
| 2015/0044829 A1 | 2/2015 | Kim et al. |
| 2015/0372149 A1 | 12/2015 | Colinge et al. |
| 2017/0271481 A1 * | 9/2017 | Anderson ........... H01L 29/0847 |
| 2018/0197965 A1 | 7/2018 | Adusumilli et al. |
| 2018/0226494 A1 | 8/2018 | Anderson et al. |
| 2018/0233503 A1 | 8/2018 | Balakrishnan |
| 2018/0240875 A1 | 8/2018 | Gluschenkov et al. |
| 2019/0189774 A1 * | 6/2019 | Bao .................. H01L 29/78642 |
| 2019/0279981 A1 | 9/2019 | Ok et al. |
| 2019/0319117 A1 | 10/2019 | Lee et al. |
| 2019/0371920 A1 | 12/2019 | Xu et al. |

\* cited by examiner

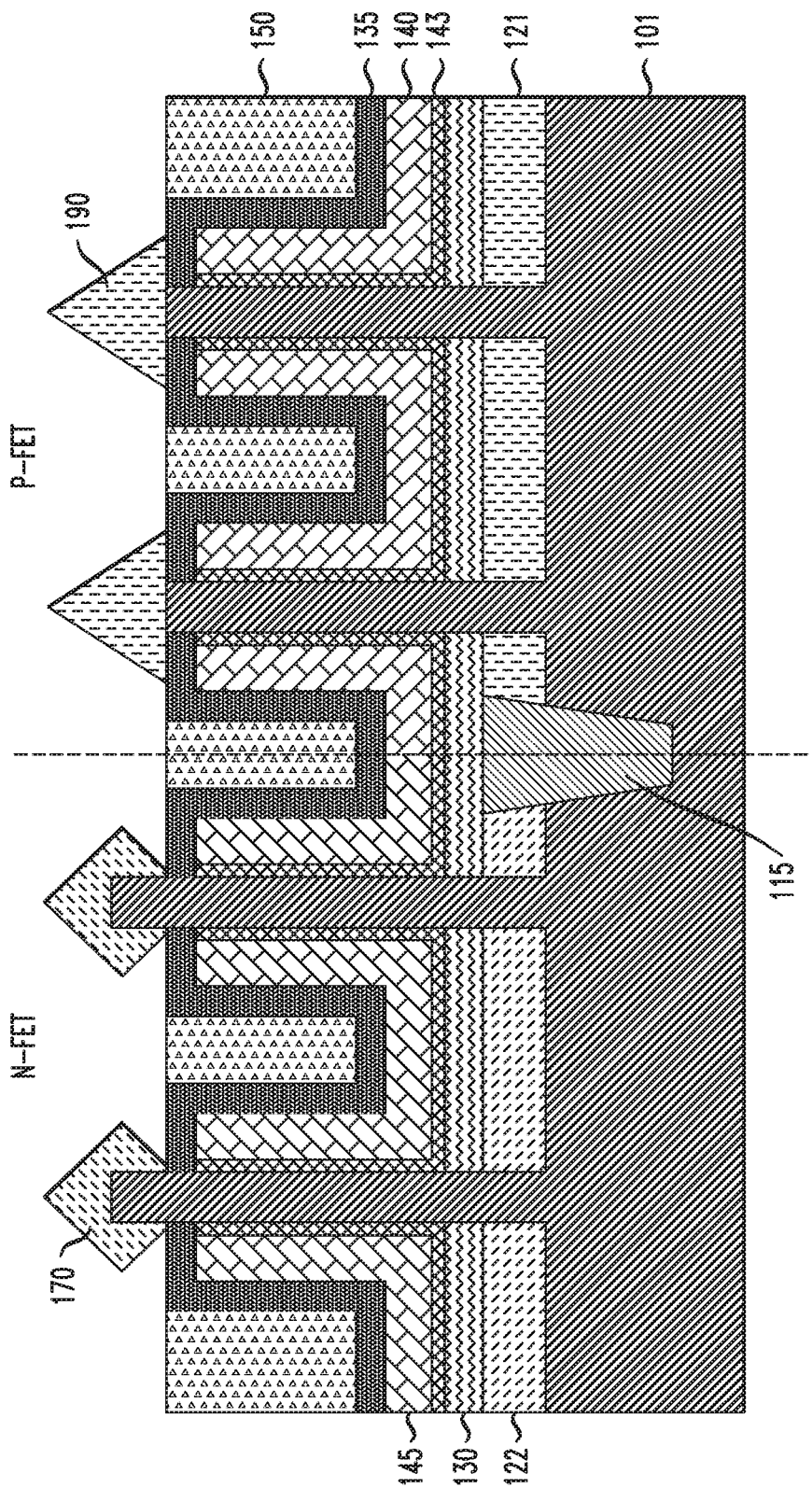

MASKLESS TOP SOURCE/DRAIN EPITAXIAL GROWTH ON VERTICAL TRANSPORT FIELD EFFECT TRANSISTOR

BACKGROUND

This disclosure relates generally to transistors, and more particularly to vertical fin-shaped field effect transistors (FinFET) and methods for their fabrication.

Vertical transport field effect transistors (VFETs) are becoming viable device options for semiconductor devices beyond the so-called "seven nanometer (7 nm) node." VFET devices include fin channels with source/drain regions at ends of the fin channels, i.e., on tops and bottoms of the fins. Current flows through the fin channels in a vertical direction (e.g., perpendicular to a substrate), for example, from a bottom source/drain region to a top source/drain region. VFET devices are designed to address the limitations of horizontal device architectures, for example, by decoupling gate length from the contact gate pitch, providing a FinFET-equivalent density at a larger contacted poly pitch (CPP), and providing lower middle-of-the-line (MOL) resistance.

In typical complementary metal oxide semiconductor (CMOS) VFET fabrication, top source/drain (S/D) epitaxial growth is used to reduce the contact resistance, e.g., phosphorus doped silicon (Si:P) in negative type FETs (n-FETs) and boron doped silicon germanium (SiGe:B) in positive type FETS (p-FETs).

SUMMARY

According to an exemplary embodiment of the present invention, a method for manufacturing a vertical transistor device includes forming a first plurality of fins in a first device region on a substrate. The first plurality of fins comprises a first portion on the substrate and a second portion on the first portion, wherein the first portion is Si and the second portion is SiGe. The method further comprises forming a second plurality of Si fins in a second device region on the substrate, wherein a length of the first plurality of fins is equal to a length of the second plurality of fins. The method further comprises forming a plurality of metal gate layers on the substrate and on at least a portion of sidewalls of the first portion of the first plurality of fins and at least a portion of sidewalls of the second plurality of fins. The method further comprises forming a spacer layer on the plurality of metal gate layers and in contact with the sidewalls of each of the first and second plurality of fins up to a top of the first portion of the first plurality of fins thereby exposing a remaining portion of the first plurality of fins and the second plurality of fins above a top surface of the spacer layer. The method further comprises forming a dielectric layer on and up to the top surface of the spacer layer. The method further comprises forming a first $GeO_2$ layer on the top surface of the spacer layer and the dielectric layer and over the exposed portion of the first plurality of fins and the second plurality of fins.

According to an exemplary embodiment of the present invention, a vertical transistor device comprises a first plurality of Si fins disposed in a first device region on a substrate. The vertical transistor device further comprises a second plurality of Si fins disposed in a second device region on the substrate. The vertical transistor device further comprises a first metal gate layer disposed on the substrate and on a portion of sidewalls of the first plurality of fins in the first device region. The vertical transistor device further comprises a second metal gate layer disposed on the substrate and on a portion of sidewalls of the second plurality of fins in the second device region. The vertical transistor device further comprises a first spacer layer disposed on the first metal gate layer and on a remaining portion of the sidewalls of the first plurality of fins thereby exposing a top surface of the first plurality of fins. The vertical transistor device further comprises a second spacer layer disposed on the second metal gate layer and on another portion of the sidewalls of the second plurality of fins thereby exposing the remaining portion of the second plurality of fins above a top surface of the second spacer layer. The vertical transistor device further comprises a dielectric layer disposed on and up to the top surface of the spacer layer. The vertical transistor device further comprises a plurality of top source/drain regions extending from the exposed top surface of the first plurality of fins in the first device region, wherein the top source/drain regions in the first device region are in a triangle shaped configuration. The vertical transistor device further comprises a plurality of top source/drain regions extending from an exposed top surface of the second plurality of fins in the second device region, wherein the top source/drain regions in the second device region are in a diamond shaped configuration. The first and second device regions of the vertical transistor device respectively comprise p-type and n-type transistor regions.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 12 is a cross-sectional view illustrating removal of the $SiO_2$ layer and SiGe epitaxial layer on the top source/drain in the n-type region in a method of manufacturing a semiconductor device, according to an exemplary embodiment of the present invention.

DETAILED DESCRIPTION

Figure 1:
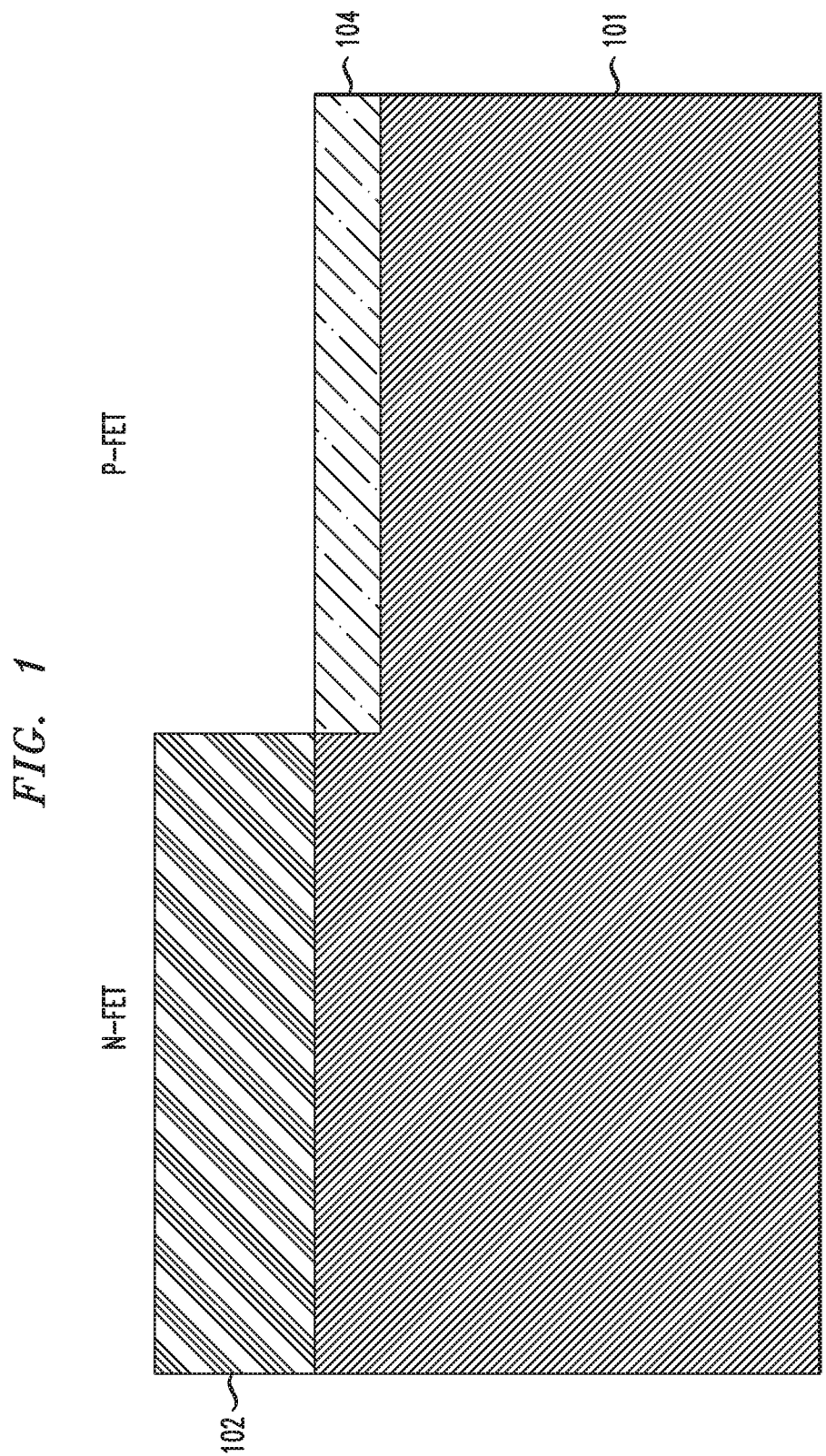
FIG. 1 is a cross-sectional view illustrating a SiGe epitaxial layer on a portion of a semiconductor substrate in a method of manufacturing a semiconductor device, according to an exemplary embodiment of the present invention.

Exemplary embodiments of the invention will now be discussed in further detail with regard to semiconductor devices and methods of manufacturing same and, in particular, to VFET devices including a maskless top source/drain (S/D) epitaxial layer.

CMOS technology is currently used for the manufacture of microprocessors, microcontrollers, static random access memory (SRAM) and other digital circuits. The word "complementary" refers to the fact that a typical CMOS digital circuit uses complementary pairs of hole-type (positive) and electron-type (negative) FETs, i.e., p-FETs and n-FETs, respectively. CMOS technology offers low static power consumption and high noise immunity, when compared to other digital technologies.

FinFET devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased MOL resistance.

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Conventional CMOS top S/D epitaxial layers needed two hard masks and patterning steps, which resulted in a complex manufacturing process. The hard mask residues or polymers on the semiconductor surface after the patterning process also interrupted the epitaxial growth. In addition, the n-fet to p-fet boundary would shift due to lack of lithography and patterning edge accuracy making it even more difficult to grow well-defined CMOS top S/D epitaxial layers. Accordingly, embodiments of the present invention correspond to structures for VFETs with maskless top S/D epitaxial layers that can be obtained in a less complex process.

FIG. 1 is a cross-sectional view illustrating a SiGe epitaxial region grown on a portion of a semiconductor substrate in a method of manufacturing a semiconductor device, according to an exemplary embodiment of the present invention. Referring to FIG. 1, a semiconductor substrate 101 includes semiconductor material including, but not limited to, silicon (Si), silicon germanium (SiGe) at various Si and Ge concentrations, silicon carbide (SiC), Si:C (carbon doped silicon), silicon germanium carbide (SiGeC), carbon doped silicon germanium (SiGe:C), compound semiconductor materials (e.g. Groups III-V), or other like semiconductor material. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

Semiconductor substrate 101 is then recessed for forming a silicon germanium (SiGe) epitaxial region 104 utilizing conventional lithography and reactive ion etching (RIE). However, semiconductor substrate 101 may be recessed using any process suitable for use in accordance with the embodiments described herein. Specifically, the recess can be formed by providing a hard mask 102 on the surface of semiconductor substrate 101 and then etching through semiconductor substrate 101. SiGe region 104 is then formed by any suitable SiGe epitaxy process with graded concentrations of Si and Ge. For example, in one embodiment, SiGe region 104 can include Si in an amount of 20% to 80% and Ge in an amount of 80% to 20%. In one embodiment, SiGe region 104 includes 25% to 75% of Si and 75% to 25% of Ge. In general, the thickness of SiGe region 104 can range from about 5 nanometers (nm) to about 10 nm.

Figure 2:
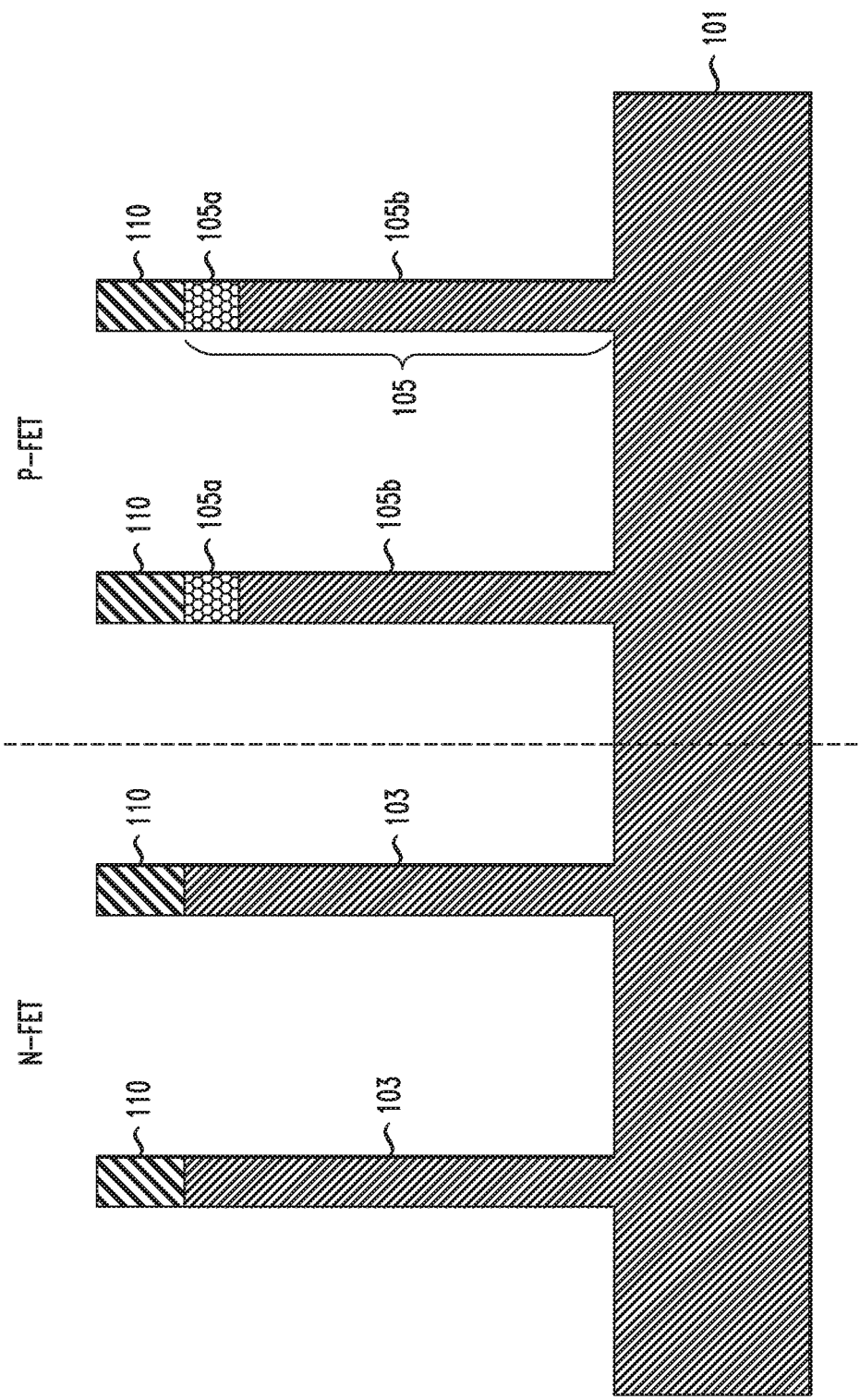
FIG. 2 is a cross-sectional view illustrating fin formation in a method of manufacturing a semiconductor device, according to an exemplary embodiment of the present invention.

FIG. 2 is a cross-sectional view illustrating fin formation in a method of manufacturing a semiconductor device, according to an exemplary embodiment of the present invention. Fins, such as fins 103 and 105, may be formed by any technique known in the art. For example, as shown, a hard mask film 110 may be deposited on the surface of semiconductor substrate 101 to preferably act as an etch stop layer that can be used, as needed, throughout the vertical fin fabrication process. As shown in FIG. 2, fins 105 include top portion 105a and bottom portion 105b. Top portion 105a includes the SiGe region 104 discussed above, and bottom portion 105b includes semiconductor substrate 101. For illustrative purposes of the present invention, hard mask film 110 may be silicon dioxide ($SiO_2$) or silicon nitride ($Si_3N_4$). In addition, a photoresist layer (not shown) may be provided above hard mask film 110. In at least one embodiment of the present invention, hard mask film 110 can be patterned or etched by any technique known in the art. For example, etching may be accomplished by patterning and/or etching using a conventional image transfer (CIT) or a sidewall image transfer (SIT) to generate any pattern or patterns of narrow and/or broad lines on a photoresist layer (not shown) as desired. Other techniques or processes may also be used in order to provide greater design flexibility with respect to forming narrow and/or broad vertical fins. While embodiments of the present invention describe channel regions as fins, the embodiments are not necessarily limited to fin channel regions, and may include nanowire channel regions. In addition, although four fins are shown in the figures for ease of explanation, more or less than four fins can be formed.

Figure 3:
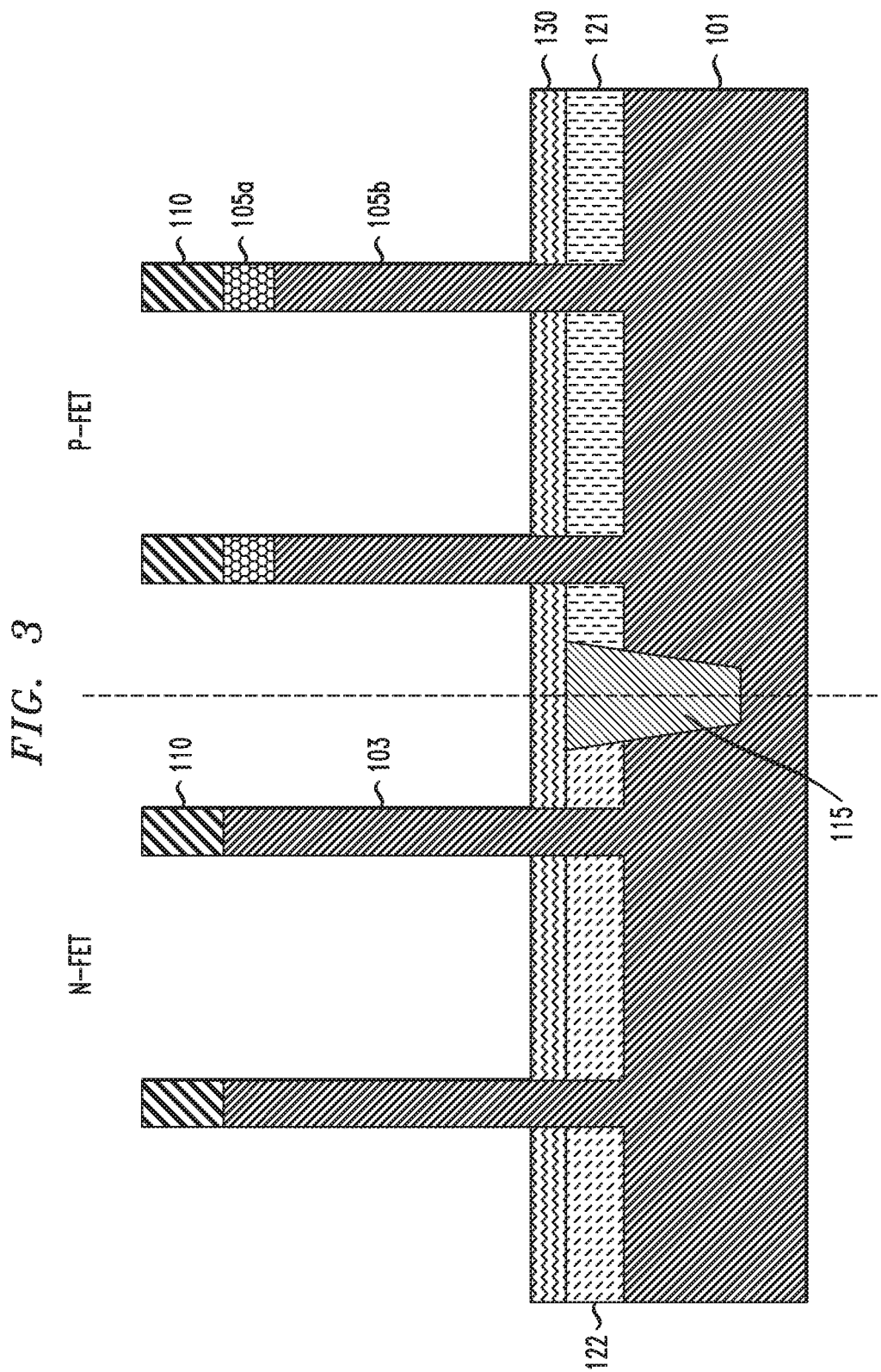
FIG. 3 is a cross-sectional view illustrating bottom source/drain and bottom spacer formation in a method of manufacturing a semiconductor device, according to an exemplary embodiment of the present invention.

FIG. 3 is a cross-sectional view illustrating bottom source/drain and bottom spacer formation in a method of manufacturing a semiconductor device, according to an exemplary embodiment of the present invention. Referring to FIG. 3, one or more trenches are formed in the substrate 101, by for example, a wet or dry etch process. A dielectric material layer including, but not necessarily limited to silicon oxide ($SiO_x$), where x is, for example, 2 in the case of silicon dioxide ($SiO_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed on the substrate 101 and in the trenches, and around the fins 103 and 105. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process, such as a chemical mechanical planarization (CMP) to remove excess dielectric material. Portions of the dielectric layer are removed from around the fins 103 and 105 in what are the n-type and p-type transistor regions (N-FET and P-FET) regions to define one or more isolation regions 115, such as, for example, shallow trench isolation (STI) regions. The patterning of the dielectric layer can be performed using appropriate masking and removal techniques, including, but not necessarily limited to, RIE and optical lithography.

Bottom source/drain regions 121 and 122 are formed in the P-FET and N-FET regions, respectively, around the fins 103 and 105. The bottom source/drain regions 121 and 122 can be formed by bottom-up epitaxial growth processes (with optional dummy vertical dielectric liners covering fin sidewalls during epitaxial growth), wherein the bottom source/drain regions 121 and 122 are grown in separate epitaxial processes from each other to certain height (thickness) such as, but not necessarily limited to about 10 nm to about 50 nm. The epitaxially grown bottom source/drain regions 121 and 122 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 121 includes boron doped SiGe, and the bottom source/drain region 122 includes phosphorus doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring further to FIG. 3, a bottom spacer layer 130 is formed on the bottom source/drain regions 121 and 122 and the isolation region 115. The bottom spacer layer 130 includes, but is not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer layer 130 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on the lateral sidewalls. Alternatively, the spacer material can be deposited using, conformal deposition techniques, and removed from vertical surfaces using directional removal techniques, such as, for example, RIE. Spacer material 130 formed on the hard masks 110 can be removed using a planarization process, such as, for example, CMP.

Figure 4:
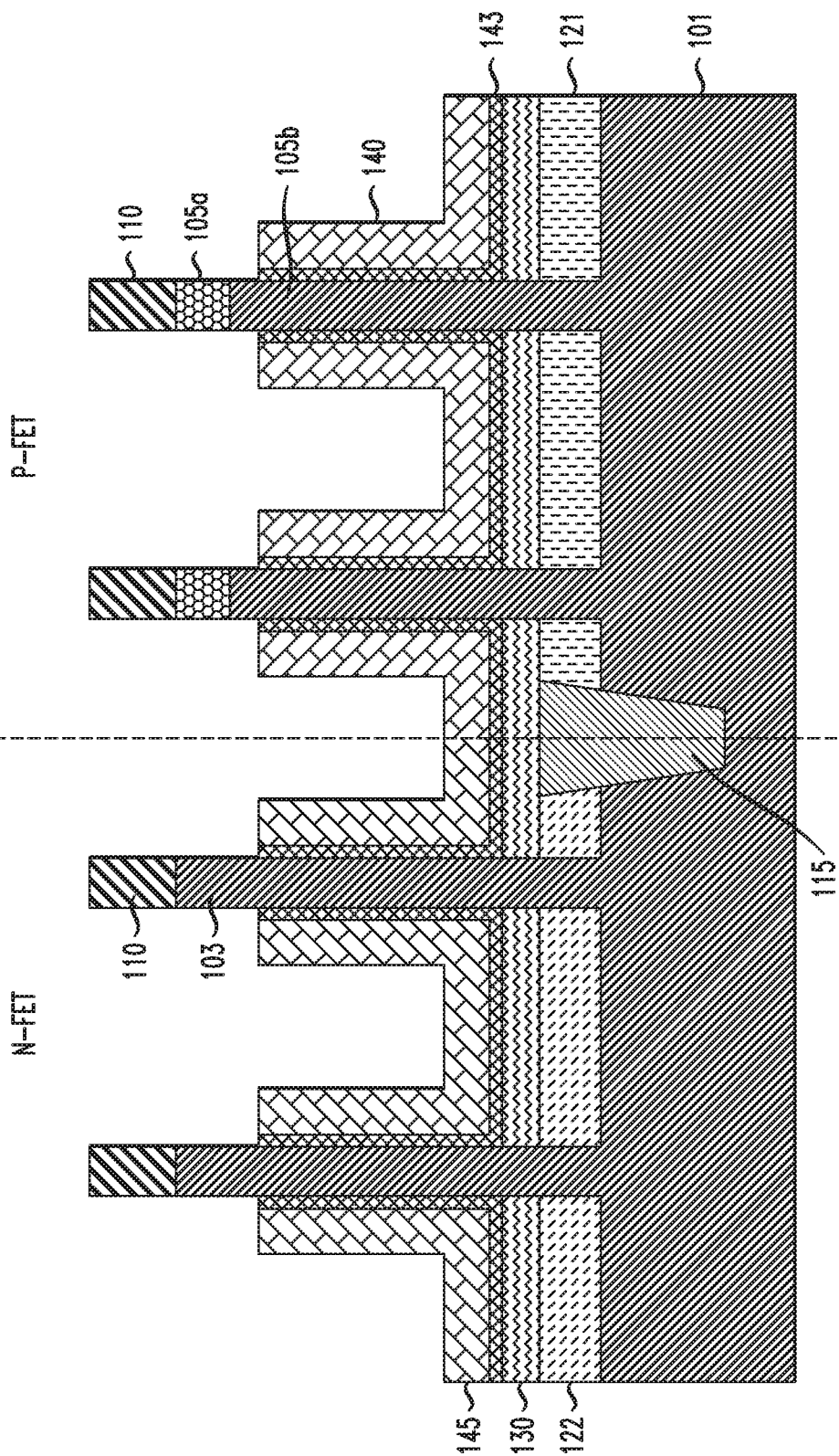
FIG. 4 is a cross-sectional view illustrating a metal gate stack formation and recessing in a method of manufacturing a semiconductor device, according to an exemplary embodiment of the present invention.

FIG. 4 is a cross-sectional view illustrating a gate metal stack formation and recessing in a method of manufacturing a semiconductor device, according to an exemplary embodiment of the present invention. Referring to FIG. 4, gate layers 140 and 145 are deposited on gate dielectric layers 143. The gate dielectric layers 143 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). For a P-FET, gate metal layer 140 is a P-metal. Suitable P-metals include, for example, P-doped polysilicon, tungsten nitride ($W_2N$, WN, $WN_2$), platinum (Pt) or combination of different metals such as titanium (Ti), titanium nitride (TiN) and tungsten (W). For an N-FET, gate metal layer 145 is an metal. Suitable N-metals include, for example, N-doped polysilicon, tantalum (Ta), tantalum nitride (TaN), titanium aluminum (TiAl), titanium aluminum carbide (TiAlC), and neodymium (Nb). N-metals, like N-type semiconductors are electron donors. P-metals, like P-type semiconductors are electron acceptors. In one example, gate metal layers 140 and 145 are about 10 nm to about 40 nm thick. Gate metal layers 140 and 145 can be one single metal or a composition of multiple metals. The gate metal layers 140 and 145 are conformally deposited on the gate dielectric layers 143 using, for example, deposition techniques including, but not limited to, CVD, PECVD, RFCVD, PVD, ALD, MLD, MBD, PLD, LSMCD, sputtering, and/or plating.

Figure 5:
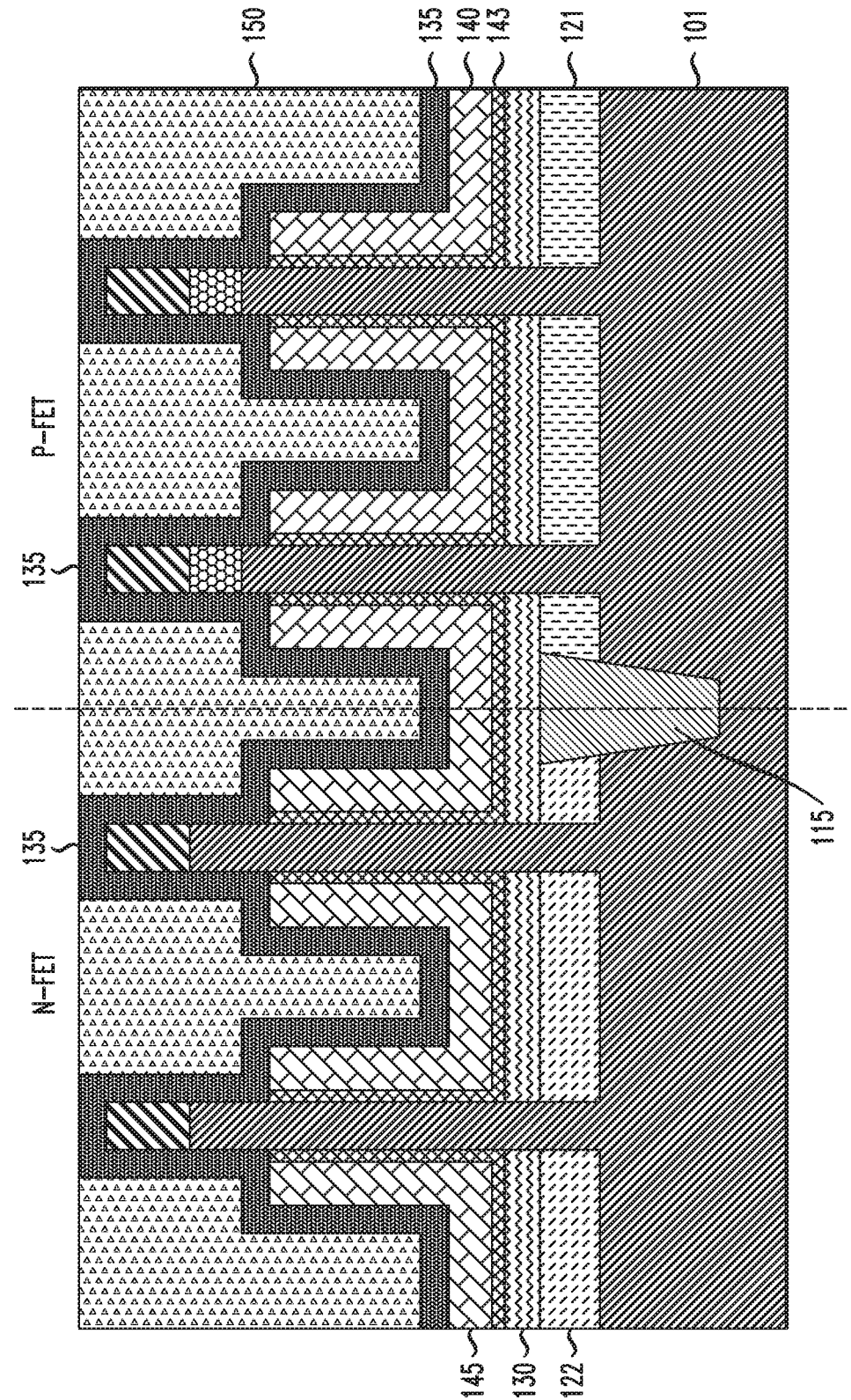
FIG. 5 is a cross-sectional view illustrating top spacer and dielectric fill formation in a method of manufacturing a semiconductor device, according to an exemplary embodiment of the present invention.

FIG. 5 is a cross-sectional view illustrating top spacer layer and dielectric fill formation in a method of manufacturing a semiconductor device, according to an exemplary embodiment of the present invention. Referring to FIG. 5, a top spacer layer 135 is formed on the gate metal layers 140 and 145, and on and around the fins 103 and 105 including the hard masks 110 thereon. The top spacer layer 135 includes, for example, silicon nitride (SiN), silicon boron nitride (SiBN), siliconborocarbonitride (SiBCN), or silicon oxycarbonitride (SiOCN). According to an embodiment of the present invention, the top spacer layer 135 is conformally deposited using, for example, deposition techniques including, but not limited to, CVD, PECVD, RFCVD, PVD, ALD, MLD, MBD, PLD, LSMCD, sputtering, and/or plating. After deposition of top spacer layer 135, vias are formed between adjacent fins.

Following deposition of the top spacer layer 135, a dielectric fill layer 150 is formed on the top spacer layer 135 to fill in the vias between the adjacent fins. The dielectric fill layer 150 includes, for example, silicon dioxide, flowable oxide, spin-on-glass, etc. According to an embodiment of the present invention, the dielectric till layer 150 is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP. In some embodiments, a thermal anneal process can be performed to densify the dielectric fill layer 150.

Figure 6:
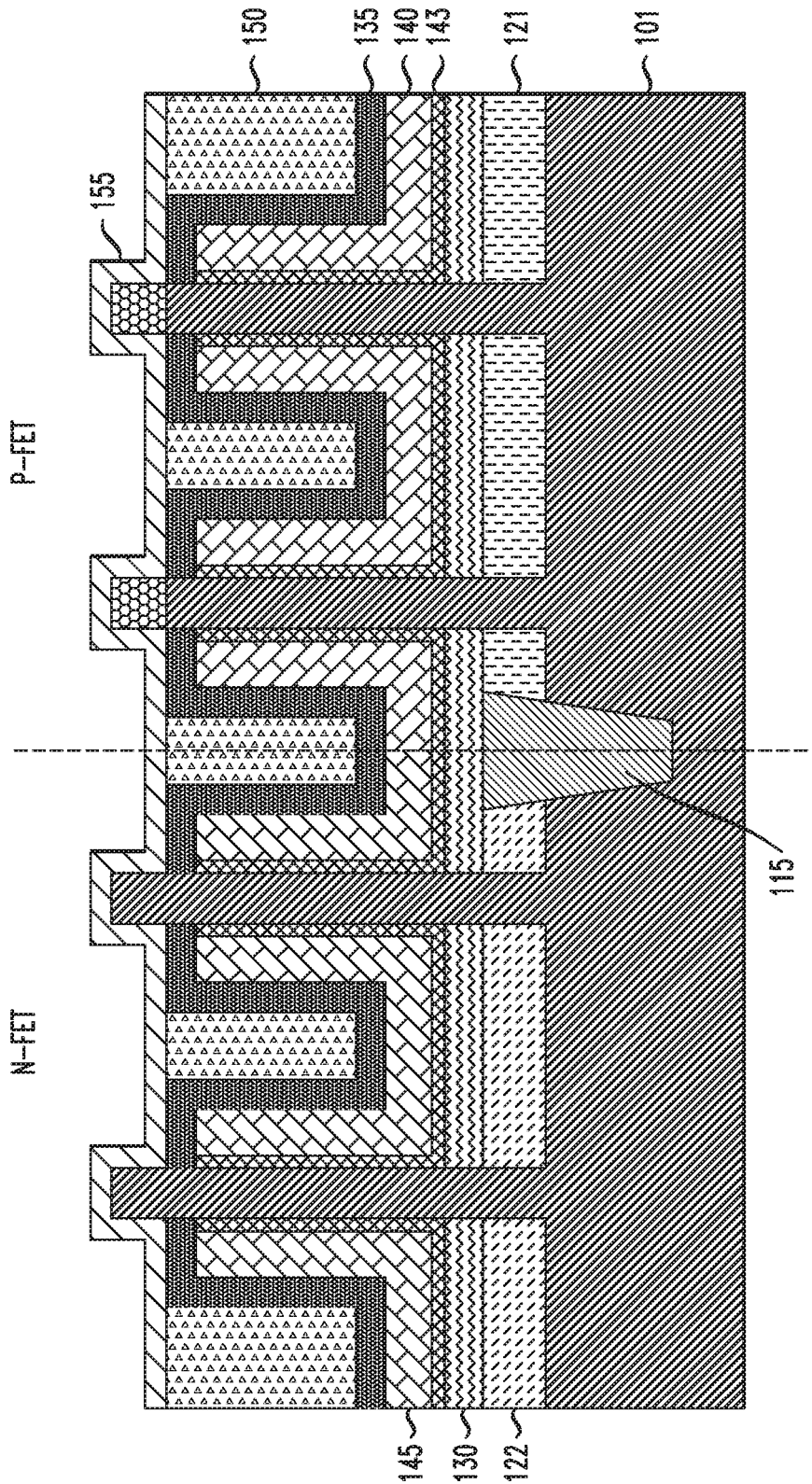
FIG. 6 is a cross-sectional view illustrating $GeO_2$ top layer formation in a method of manufacturing a semiconductor device, according to an exemplary embodiment of the present invention.

FIG. 6 is a cross-sectional view illustrating $GeO_2$ formation in a method of manufacturing a semiconductor device, according to an exemplary embodiment of the present invention. Referring to FIG. 6, the top spacer layer 135 and hardmasks 110 are selectively removed from the upper surfaces of the fins 103 and 105 to expose the upper portion of fins 103 and the top portions 105a of fins 105. The removal is performed using, for example, a selective etch process, which is selective to the material of the fins 103 and 105. In one illustrative embodiment, the top spacer layer 135 and hardmasks 110 are selectively removed using, for example, a hot phosphoric acid etchant or a HF/HCl etchant. In addition, a portion of dielectric fill layer 150 is selectively removed to the top surface of top spacer layer 135 as shown in FIG. 6 using, for example, an HF etchant, or dry etch with a fluorine-based gas such as $CF_4$, $SF_6$, and $NF_3$. If necessary, a planarization step can be carried on the top surface of top spacer and dielectric fill layers 135 and 150.

Following the removal of the hardmasks 110 and the portions of the top spacer and dielectric fill layers 135 and 150 to expose the upper portions of the fins 103 and top portions 105a of fins 105, a $GeO_2$ layer 155 is formed over the top surface of top spacer and dielectric fill layers 135 and 150 and around the exposed portions of fins 103 and top portions 105a of fins 105. According to an embodiment of the present invention, the $GeO_2$ layer 155 is deposited using, for example, any conventional technique including, for example, ALD deposition or CVD deposition. In one embodiment, the thickness of $GeO_2$ layer 155 can range from about 2 nm to about 20 nm. In one embodiment, the thickness of $GeO_2$ layer 155 can range from about 5 nm to about 10 nm.

Figure 7:
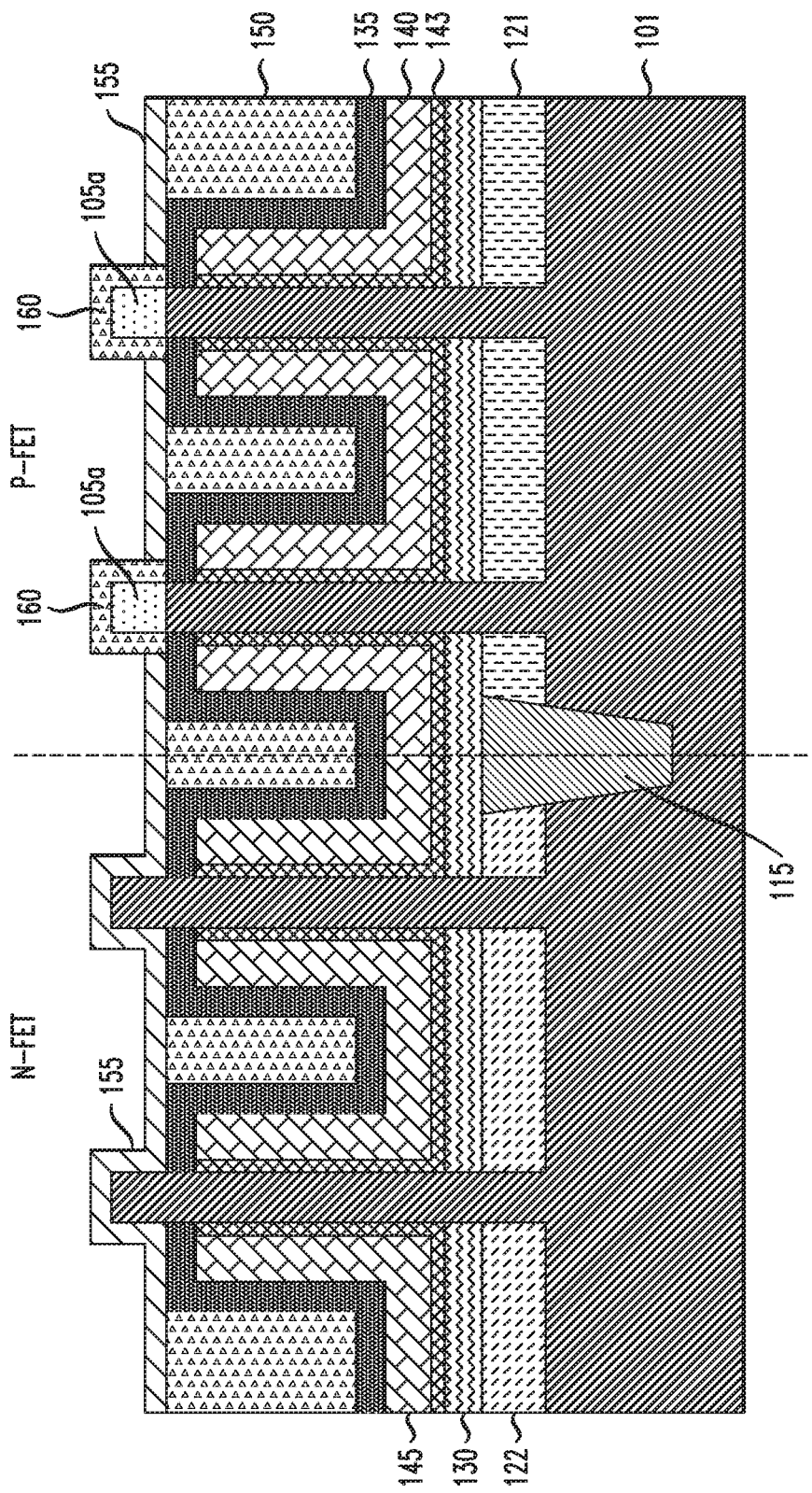
FIG. 7 is a cross-sectional view illustrating $SiO_2$ formation in a method of manufacturing a semiconductor device, according to an exemplary embodiment of the present invention.

FIG. 7 is a cross-sectional view illustrating $SiO_2$ formation in a method of manufacturing a semiconductor device, according to an exemplary embodiment of the present invention. Referring to FIG. 7, the $GeO_2$ layer 155 on the sidewalls and top surface of the top portions 105a of fins 105 are converted to $SiO_2$ layer 160 and the content of Ge in the SiGe top portions 105a of fins 105 is increased after performing thermal condensation. In one illustrative embodiment, thermal condensation is carried out in which germanium from the $GeO_2$ layer 155 is driven out and diffused into the SiGe top portions 105a of fins 105, and a portion of the silicon in the SiGe top portions 105a of fins 105 is driven out and diffused into the $GeO_2$ layer 155 to convert the $GeO_2$ layer 155 on the sidewalls and top surface of the top portions 105a of fins 105 into $SiO_2$ layer 160. For example, in one illustrative embodiment, when the top portions 105a of fins 105 comprises Si75% Ge25%, the thermal condensation will diffuse germanium from the $GeO_2$ layer 155 into the SiGe top portions 105a of fins 105 and convert the Si75% Ge25% top portion to a Si50% Ge50% top portion. Thus, in some exemplary embodiments, the diffusion of germanium from the $GeO_2$ layer 155 into the SiGe top portions 105a of fins 105 provides an added germanium content to the SiGe top portions 105a of fins 105. The remaining portion of $GeO_2$ layer 155 is left on the top surface of top spacer and dielectric fill layers 135 and 150 and around the exposed portions of fins 103.

The thermal condensation process is performed at a temperature sufficient enough to cause diffusion of germanium out of the $GeO_2$ layer 155 and into the top portions 105a of fins 105, and diffusion of silicon from the top portions 105a of fins 105 and into the $GeO_2$ layer 155 to convert the $GeO_2$ layer 155 on the sidewalls and top surface of the top portions 105a of fins 105 into $SiO_2$ layer 160. In one illustrative embodiment, the thermal condensation is performed at a temperature from about 300° C. to about 800° C. In another illustrative embodiment, the thermal condensation is performed at a temperature from about 400° C. to about 600° C.

In addition, the thermal condensation is performed in the presence of an inert gas such as He, Ar, $N_2$, Xe, Kr, Ne and mixtures thereof. The thermal condensation may be carried out for a variable period of time. In one embodiment, the thermal condensation is carried out for a time period from milli seconds to about 30 minutes, depending on temperature. In another embodiment, the thermal condensation may be carried out for a time period from about 1 minute to about 5 minutes. The thermal condensation process may be carried out at a single targeted temperature, or various ramp and soak cycles using various ramp rates and soak times can be employed.

Figure 8:
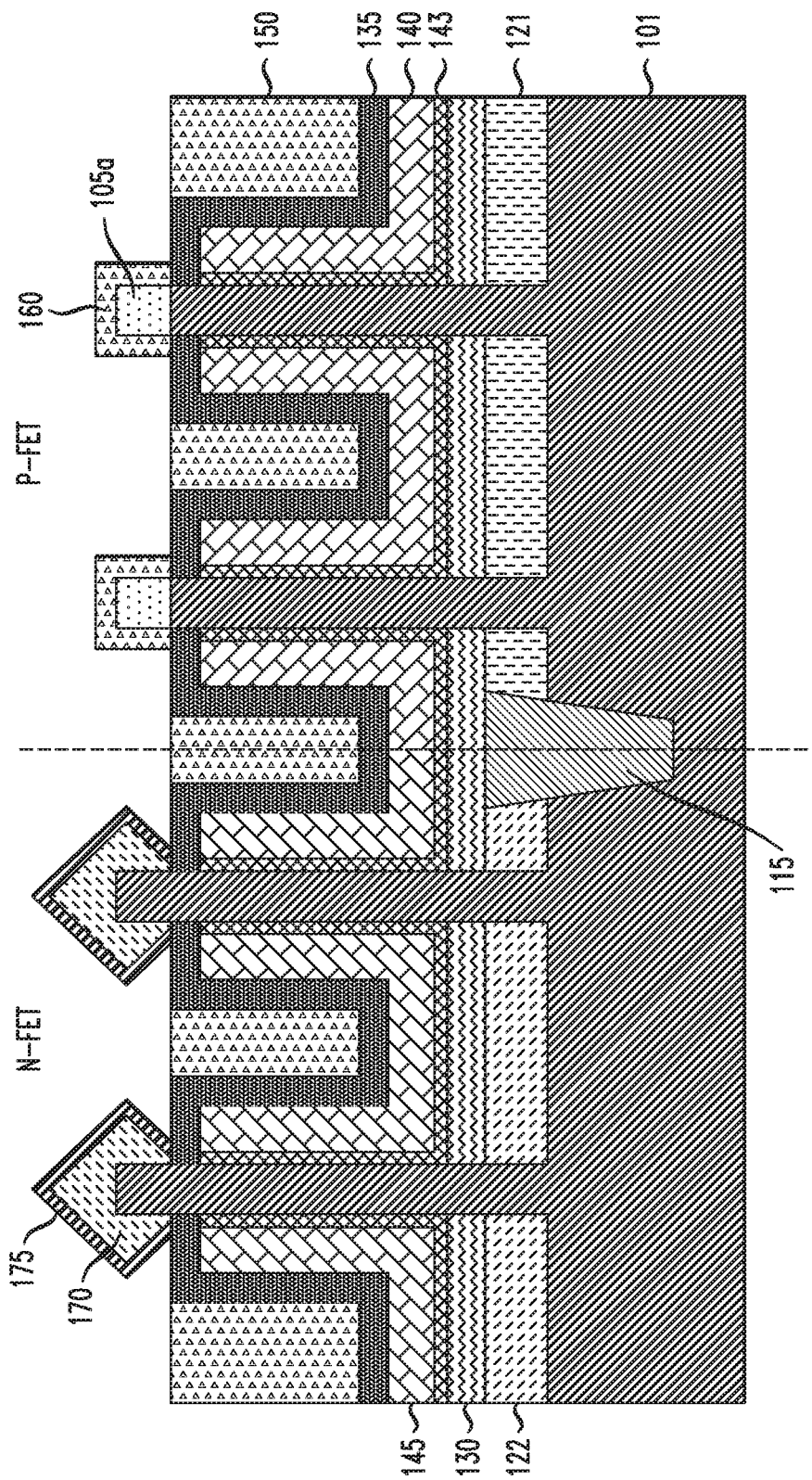
FIG. 8 is a cross-sectional view illustrating top source/drain formation and deposition of a SiGe epitaxial layer in the n-type region in a method of manufacturing a semiconductor device, according to an exemplary embodiment of the present invention.

FIG. 8 is a cross-sectional view illustrating top source/drain formation and deposition of a SiGe epitaxial layer in a method of manufacturing a semiconductor device, according to an exemplary embodiment of the present invention. Referring to FIG. 8, the $GeO_2$ layer 155 is removed from the top surface of top spacer and dielectric fill layers 135 and 150 and around upper portions of the fins 105 to expose the upper portions of the fins 105. The removal is performed using, for example, deionized water.

Following the removal of $GeO_2$ layer 155 to expose the upper portions of fins 105, the top source/drain region 170 in the n-type region is epitaxially grown in epitaxial growth processes from the upper portions of the fins 103. The epitaxially grown top source/drain region 170 can be formed in different epitaxial growth processes from each other and can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), at various concentrations. For example, in a non-limiting example, a dopant concentration range may be $1 \times 10^{18}/cm^3$ to $1 \times 10^{21}/cm^3$. According to an embodiment, the top source/drain region 170 includes phosphorus doped silicon. As shown in FIG. 8, epitaxially grown top source/drain region 170 is formed in a diamond shaped configuration around the exposed upper portions of fins 103.

Next, SiGe epitaxial layer 175 is epitaxially grown in an epitaxial growth processes from top source/drain region 170. SiGe epitaxial layer 175 is formed by any suitable SiGe epitaxy process with graded concentrations of Si and Ge. For example, in one embodiment, SiGe epitaxial layer 175 can include Si in an amount of 20% to 80% and Ge in an amount of 80% to 20%. In one embodiment, SiGe epitaxial layer 175 includes Si in an amount of 75% and Ge in an amount of 25%. In general, the thickness of SiGe epitaxial layer 175 can range from about 2 nm to about 10 nm.

Figure 9:
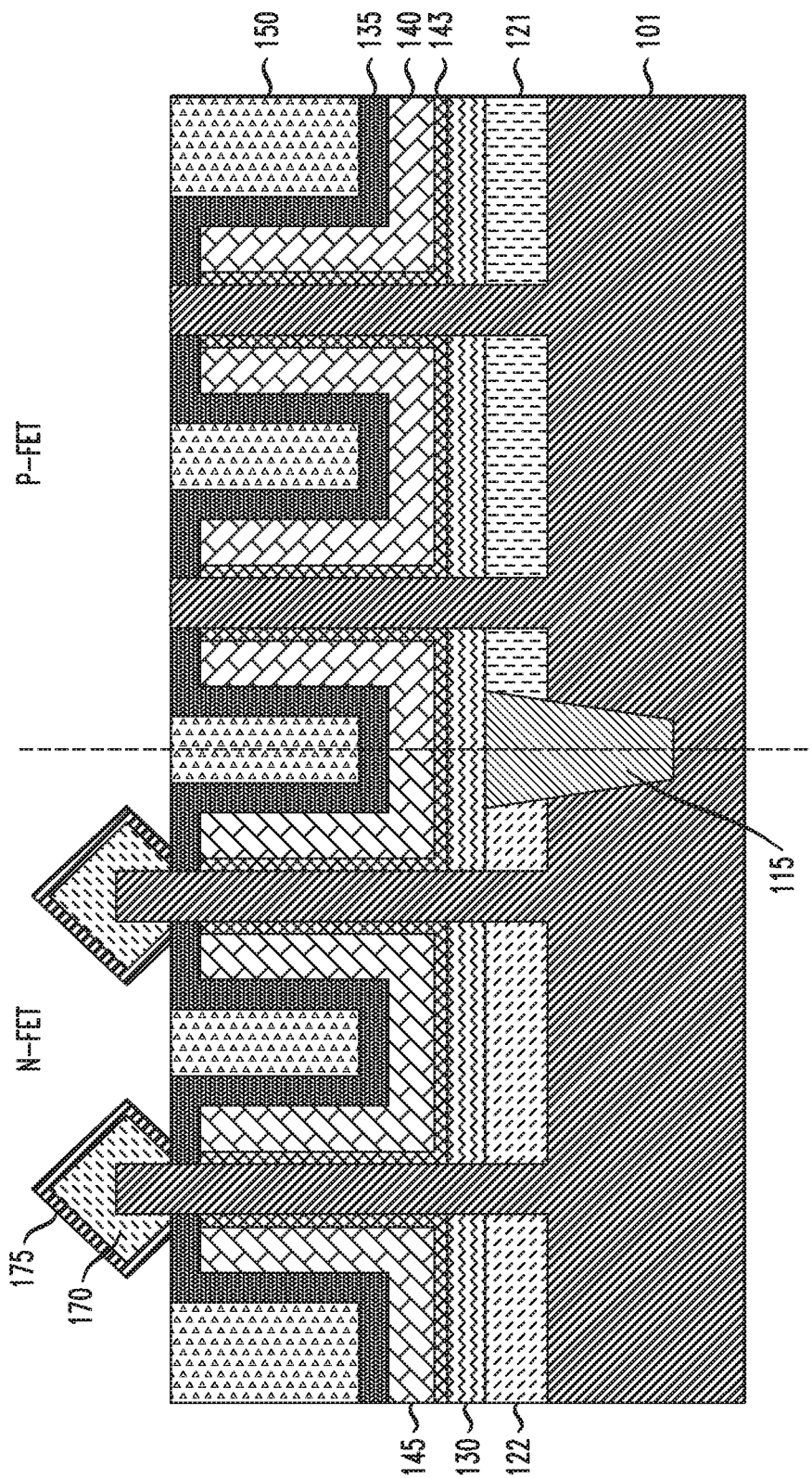
FIG. 9 is a cross-sectional view illustrating removal of the $SiO_2$ layer and SiGe upper portions of fins in the p-type region in a method of manufacturing a semiconductor device, according to an exemplary embodiment of the present invention.

FIG. 9 is a cross-sectional view illustrating removal of the $SiO_2$ layer and SiGe upper portions of fins in the p-type region in a method of manufacturing a semiconductor device, according to an exemplary embodiment of the present invention. Referring to FIG. 9, $SiO_2$ layer 160 and SiGe upper portions 105a of fins 105 in the p-type region are selectively removed to expose the top surface of the bottom portions 105b of fins 105 using any conventional selective etching process. For example, $SiO_2$ layer 160 and SiGe upper portions 105a of fins 105 can be removed using, for example, a HF solution and HCl gas phase etchant or a hot SC1 cleaning.

Figure 10:
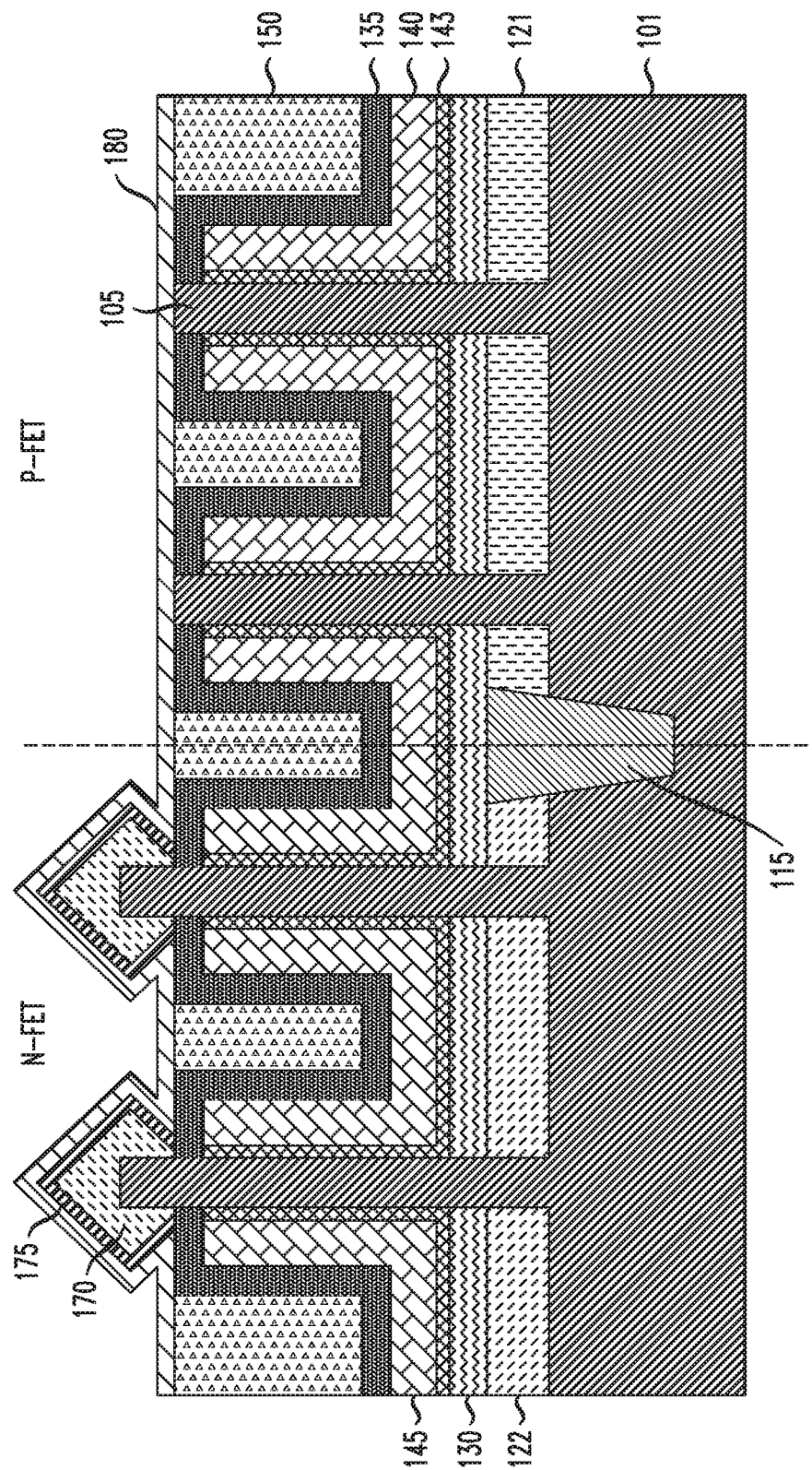
FIG. 10 is a cross-sectional view illustrating $GeO_2$ top layer formation on top source/drain regions in n- and p-type regions in a method of manufacturing a semiconductor device, according to an exemplary embodiment of the present invention.

FIG. 10 is a cross-sectional view illustrating $GeO_2$ top layer formation on top source/drain regions in n- and p-type regions in a method of manufacturing a semiconductor device, according to an exemplary embodiment of the present invention. Referring to FIG. 10, a $GeO_2$ layer 180 is formed over the top surface of top spacer layer, 135, dielectric fill layer 150 and fins 105, and around the SiGe epitaxial layer 175. According to an embodiment of the present invention, the GeO$_2$ layer 155 is deposited using, for example, any conventional technique including, for example, ALD deposition or CVD deposition. In one embodiment, the thickness of GeO$_2$ layer 155 can range from about 2 nm to about 20 nm. In one embodiment, the thickness of GeO$_2$ layer 155 can range from about 5 nm to about 10 nm.

Figure 11:
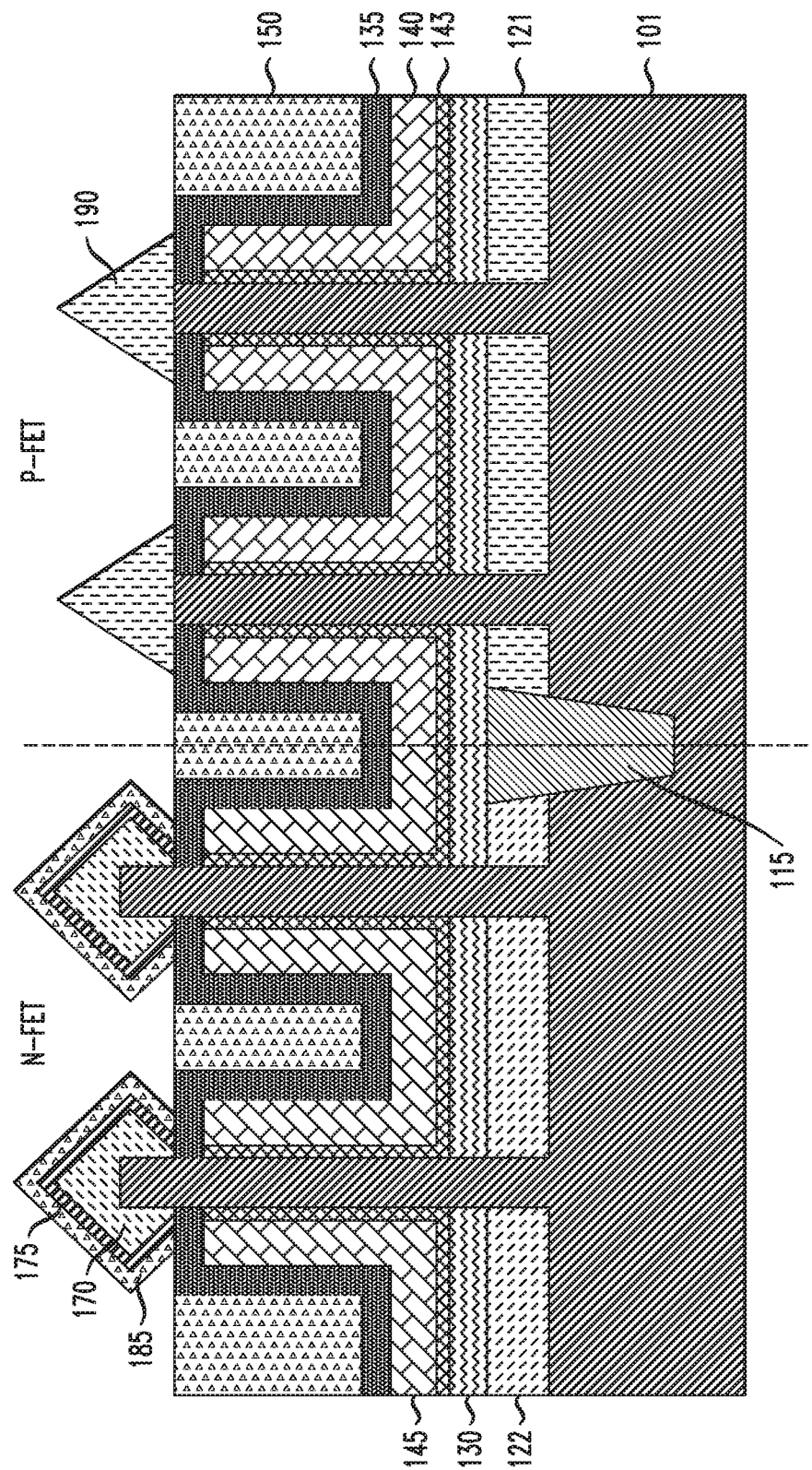
FIG. 11 is a cross-sectional view illustrating top source/drain formation in the p-type region in a method of manufacturing a semiconductor device, according to an exemplary embodiment of the present invention.

FIG. 11 is a cross-sectional view illustrating top source/drain formation in the p-type region in a method of manufacturing a semiconductor device, according to an exemplary embodiment of the present invention. Referring to FIG. 11, the GeO$_2$ layer 180 on the sidewalls of SiGe layer 175 is converted to SiO$_2$ layer 185 and the content of Ge in the SiGe layer 175 is increased after performing thermal condensation. In one illustrative embodiment, thermal condensation is carried out in which germanium from the GeO$_2$ layer 180 is driven out and diffused into the SiGe layer 175, and a portion of the silicon in the SiGe layer 175 is driven out and diffused into the GeO$_2$ layer 180 on the sidewalls of SiGe layer 175 to convert the GeO$_2$ layer 180 into SiO$_2$ layer 185. The remaining portion of GeO$_2$ layer 180 is left on the top surface of top spacer and dielectric fill layers 135 and 150 and fins 105.

The thermal condensation process is performed at temperature sufficient enough to cause diffusion of germanium out of the GeO$_2$ layer 180 and into SiGe layer 175 and diffusion of silicon from SiGe layer 175 and into the GeO$_2$ layer 180 to convert the GeO$_2$ layer 180 on the sidewalls of SiGe layer 175 into SiO$_2$ layer 185. In one illustrative embodiment, the thermal condensation is performed at a temperature from about 300° C. to about 800° C. In one illustrative embodiment, the thermal condensation is performed at a temperature from about 400° C. to about 600° C.

In addition, the thermal condensation is performed in the presence of an inert gas such as He, Ar, N$_2$, Xe, Kr, Ne and mixtures thereof. The thermal condensation may be carried out for a variable period of time. In one embodiment, the thermal condensation is carried out for a time period from milli seconds to about 30 minutes, depending on temperature. In another embodiment, the thermal condensation may be carried out for a time period from about 1 minute to about 5 minutes. The thermal condensation process may be carried out at a single targeted temperature, or various ramp and soak cycles using various ramp rates and soak times can be employed.

Next, the remaining GeO$_2$ layer 180 is removed from the top surface of top spacer and dielectric till layers 135 and 150 and fins 105 using, for example, deionized water. Following the removal of GeO$_2$ layer 180 to expose the top surface of top spacer layer 135, dielectric fill layer 150 and fin 105, the top source/drain region 190 in the p-type region is epitaxially grown in epitaxial growth processes from the upper portions of the fins 105. The epitaxially grown top source/drain region 190 can be formed in different epitaxial growth processes from each other and can be in-situ doped. Other alternative doping techniques can be used as discussed above for the n-type region. Suitable p-type dopants may include, for example, boron (B), gallium (Ga), indium (In), and thallium (Tl) at various concentrations. For example, in a non-limiting example, a dopant concentration range may be 1×10$^{18}$/cm$^3$ to 1×10$^{21}$/cm$^3$. According to an embodiment, the top source/drain region 190 includes boron doped SiGe. As shown in FIG. 11, epitaxially grown top source/drain region 190 is formed in a triangle shaped configuration around the exposed top surface of fins 105.

FIG. 12 is a cross-sectional view illustrating removal of the SiO$_2$ layer and SiGe epitaxial layer on the top source/drain in the n-type region in a method of manufacturing a semiconductor device, according to an exemplary embodiment of the present invention. Referring to FIG. 12, SiO$_2$ layer 185 and SiGe layer 175 in the n-type region are selectively removed to expose the top surface of the source/drain region 170 using any conventional selective etching process. For example, SiO$_2$ layer 185 and SiGe layer 175 can be removed using, for example, an HF solution and a HCl gas phase etchant or a hot SC1 cleaning.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A vertical transistor device, comprising:
   a first plurality of Si fins disposed in a first device region on a substrate;
   a second plurality of Si fins disposed in a second device region on the substrate;
   a first metal gate layer disposed on the substrate and on a portion of sidewalls of the first plurality of fins extending from the substrate in the first device region;
   a second metal gate layer disposed on the substrate and on a portion of sidewalls of the second plurality of fins extending from the substrate in the second device region;
   a first spacer layer disposed on a top surface of the first metal gate layer and on a remaining portion of the sidewalls of the first plurality of fins;
   a second spacer layer disposed on a top surface of the second metal gate layer and on another portion of the sidewalls of the second plurality of fins thereby exposing a remaining portion of the second plurality of fins above a top surface of the second spacer layer;
   a dielectric layer disposed on and up to the top surface of the first and second spacer layers;
   a plurality of top source/drain regions extending from a top surface of the first plurality of fins in the first device region, wherein the top source/drain regions in the first device region are in a triangle shaped configuration; and
   a plurality of top source/drain regions extending from a top surface of the second plurality of fins in the second device region, wherein the top source/drain regions in the second device region are in a diamond shaped configuration.

2. The vertical transistor device according to claim 1, further comprising:
   a plurality of bottom source/drain regions on the substrate and around lower portions of each of the first and second plurality of fins in the first and second device regions.

3. The vertical transistor device according to claim 2, wherein the plurality of bottom source/drain regions in the first device region comprise a boron doped silicon-germanium epitaxial material and the plurality of bottom source/drain regions in the second device region comprise a phosphorus doped silicon epitaxial material.

4. The vertical transistor device according to claim 1, wherein the first and second metal gate layers comprise a gate dielectric layer in the first device region and the second device region.

5. The vertical transistor device according to claim 4, wherein the gate dielectric layer in the first device region and the second device region comprises a high-K material.

6. The vertical transistor device according to claim 5, wherein the high-K material comprises one of $HfO_2$ (hafnium oxide), $ZrO_2$ (zirconium dioxide), hafnium zirconium oxide $Al_2O_3$ (aluminum oxide), and $Ta_2O_5$ (tantalum pentoxide).

7. The vertical transistor device according to claim 2, further comprising a third spacer layer disposed on the plurality of bottom source/drain regions.

8. The vertical transistor device according to claim 7, wherein the third spacer layer comprises one of silicon nitride (SiN), silicon boron nitride (SiBN), siliconborocarbonitride (SiBCN), silicon oxycarbonitride (SiOCN) and SiO.

9. The vertical transistor device according to claim 1, wherein the first and second device regions respectively comprise p-type and n-type transistor regions.

10. An integrated circuit, comprising:
a plurality of vertical transistor devices, wherein at least one of the vertical transistor devices comprises:
a first plurality of Si fins disposed in a first device region on a substrate;
a second plurality of Si fins disposed in a second device region on the substrate;
a first metal gate layer disposed on the substrate and on a portion of sidewalls of the first plurality of fins extending from the substrate in the first device region;
a second metal gate layer disposed on the substrate and on a portion of sidewalls of the second plurality of fins extending from the substrate in the second device region;
a first spacer layer disposed on a top surface of the first metal gate layer and on a remaining portion of the sidewalls of the first plurality of fins;
a second spacer layer disposed on a top surface of the second metal gate layer and on another portion of the sidewalls of the second plurality of fins thereby exposing a remaining portion of the second plurality of fins above a top surface of the second spacer layer;
a dielectric layer disposed on and up to the top surface of the first and second spacer layers;
a plurality of top source/drain regions extending from a top surface of the first plurality of fins in the first device region, wherein the top source/drain regions in the first device region are in a triangle shaped configuration; and
a plurality of top source/drain regions extending from a top surface of the second plurality of fins in the second device region, wherein the top source/drain regions in the second device region are in a diamond shaped configuration.

11. The integrated circuit according to claim 10, further comprising:
a plurality of bottom source/drain regions on the substrate and around lower portions of each of the first and second plurality of fins in the first and second device regions.

12. The integrated circuit according to claim 11, wherein the plurality of bottom source/drain regions in the first device region comprise a boron doped silicon-germanium epitaxial material and the plurality of bottom source/drain regions in the second device region comprise a phosphorus doped silicon epitaxial material.

13. The integrated circuit according to claim 10, wherein the first and second metal gate layers comprise a gate dielectric layer in the first device region and the second device region.

14. The integrated circuit according to claim 13, wherein the gate dielectric layer in the first device region and the second device region comprises a high-K material.

15. The integrated circuit according to claim 14, wherein the high-K material comprises one of $HfO_2$ (hafnium oxide), $ZrO_2$ (zirconium dioxide), hafnium zirconium oxide $Al_2O_3$ (aluminum oxide), and $Ta_2O_5$ (tantalum pentoxide).

16. The integrated circuit according to claim 11, further comprising a third spacer layer disposed on the plurality of bottom source/drain regions.

17. The integrated circuit according to claim 10, wherein the first and second device regions respectively comprise p-type and n-type transistor regions.

18. A semiconductor structure, comprising:
a first plurality of fins disposed in a first device region on a substrate, wherein the first plurality of fins comprises a first portion on the substrate and a second portion on the first portion, wherein the first portion is Si and the second portion is SiGe;
a second plurality of Si fins disposed in a second device region on the substrate, wherein a length of the first plurality of fins is equal to a length of the second plurality of fins;
a plurality of metal gate layers disposed on the substrate and on at least a portion of sidewalls of the first portion of the first plurality of fins extending from substrate and at least a portion of sidewalls of the second plurality of fins extending from substrate;
a spacer layer disposed on a top surface of the plurality of metal gate layers and in contact with the sidewalls of each of the first and second plurality of fins exposing a remaining portion of the first plurality of fins and the second plurality of fins above a top surface of the spacer layer;
a dielectric layer disposed on and up to the top surface of the spacer layer; and
a first $GeO_2$ layer disposed on the top surface of the spacer layer and the dielectric layer and over the exposed portion of the first plurality of fins and the second plurality of fins.

19. The semiconductor structure according to claim 18, further comprising:
a plurality of bottom source/drain regions disposed on the substrate and around a portion of the first portion of the first plurality of fins in the first device region and around a lower portion of the second plurality of fins in the second device region.

20. The semiconductor structure according to claim 18, wherein the first and second device regions respectively comprise p-type and n-type transistor regions.

* * * * *